(12) United States Patent
Canella

(10) Patent No.: US 8,690,379 B2
(45) Date of Patent: *Apr. 8, 2014

(54) BATTERY-POWERED LIGHTS AND HOLDER FOR SAME

(76) Inventor: Robert L. Canella, Nampa, ID (US)

( * ) Notice: Subject to any disclaimer, the term of this patent is extended or adjusted under 35 U.S.C. 154(b) by 194 days.

This patent is subject to a terminal disclaimer.

(21) Appl. No.: 13/076,000

(22) Filed: Mar. 30, 2011

(65) Prior Publication Data

US 2011/0235313 A1    Sep. 29, 2011

Related U.S. Application Data

(63) Continuation-in-part of application No. 12/761,807, filed on Apr. 16, 2010, now abandoned, which is a continuation of application No. 12/111,077, filed on Apr. 28, 2008, now Pat. No. 7,699,493, which is a continuation of application No. 11/246,449, filed on Oct. 6, 2005, now Pat. No. 7,364,319.

(60) Provisional application No. 60/616,910, filed on Oct. 7, 2004.

(51) Int. Cl.
*F21L 4/04*    (2006.01)

(52) U.S. Cl.
USPC .......................... 362/200; 362/205; 362/394

(58) Field of Classification Search
USPC ............ 362/158, 183, 200, 202, 205, 249.01, 362/249.02, 276, 394, 802
See application file for complete search history.

(56) References Cited

U.S. PATENT DOCUMENTS

| | | | |
|---|---|---|---|
| 3,543,016 A | 11/1970 | Jones | |
| 3,794,825 A | 2/1974 | Krupansky | |
| 4,302,800 A * | 11/1981 | Pelletier | .............. 362/249.11 |
| 4,875,147 A | 10/1989 | Auer | |
| 5,535,107 A | 7/1996 | Prok | |
| 6,280,049 B1 | 8/2001 | Tam | |
| 6,513,952 B1 | 2/2003 | Johnson et al. | |
| 6,629,767 B2 | 10/2003 | Osiecki et al. | |
| 6,802,621 B2 | 10/2004 | Adeler | |
| 6,929,379 B2 | 8/2005 | Clemente et al. | |
| 7,364,319 B2 | 4/2008 | Canella | |

FOREIGN PATENT DOCUMENTS

DE    3409099 A1    9/1985

* cited by examiner

*Primary Examiner* — Hargobind S Sawhney
(74) *Attorney, Agent, or Firm* — TraskBritt

(57) ABSTRACT

A personal light including a battery power source connected in series with a light-emitting diode (LED) light source and a switching mechanism configured for non-contact actuation are disposed within a housing assembly. Linear, or rotational, switch actuation element movement may be employed. A holder for the personal light is also disclosed.

18 Claims, 14 Drawing Sheets

BATTERY-POWERED LIGHTS AND HOLDER FOR SAME

CROSS-REFERENCE TO RELATED APPLICATIONS

This application is a continuation-in-part of U.S. patent application Ser. No. 12/761,807, filed Apr. 16, 2010, now abandoned, which is a continuation of U.S. patent application Ser. No. 12/111,077, filed Apr. 28, 2008, now U.S. Pat. No. 7,699,493 issued Apr. 20, 2010, which is a continuation of U.S. patent application Ser. No. 11/246,449, filed Oct. 6, 2005, now U.S. Pat. No. 7,364,319 issued Apr. 29, 2008, which application claims the benefit of U. S. Provisional Patent Application Ser. No. 60/616,910, filed Oct. 7, 2004, the disclosure of each of which applications and patents is incorporated herein in its entirety by this reference.

BACKGROUND

The present invention relates generally to portable lights and, more specifically, to personal lights employing a non-contact switch actuating mechanism operable to control actuation of a light source powered by at least one battery, the light source and battery being disposed in a sealed housing.

BRIEF SUMMARY

The present invention comprises a compact, battery-powered light, which may be of cuboidal configuration. The term "cuboidal," as used herein, does not necessarily denote a perfect cube, but a three-dimensional shape generally defined by rectangular sides at mutually perpendicular angles. The size of the light may be optimized for a particular number and series of batteries, and to optimize yield in terms of material usage. Light is output from a face of the light rather than from an end, as in conventional, substantially tubular, battery-powered lights.

In one embodiment, the light may be designed to function at a selected voltage through a current-limiting device connected in series with a battery power source, a light source comprising a light-emitting diode (LED) and a switch with a non-contact actuating mechanism. A suitable reflector may be employed to maximize reflection of light emanating from the LED, and a magnifying lens may be associated with the LED opposite the reflector to enhance the light output and magnify the narrow beam of the LED. A switch using a non-contact actuator, such as a Hall-effect-type magnetic reed switch, may be used to activate and deactivate the light, rather than a conventional, contact-type switch which is susceptible to wear and corrosion. At least the LED, battery and switch are environmentally isolated within a chamber in the light housing, the reed switch being responsive to the presence or absence of a magnetic field in close proximity thereto exterior to the chamber and provided by a movable element bearing at least one magnet. Thus, the light may be fabricated to exhibit a high water resistance, even under increased pressure, as well as being suitable for use in potentially explosive environments such as mines and certain manufacturing facilities wherein fumes or vapors may be highly susceptible to ignition from a spark associated with actuation of a conventional contact-type switch.

A machine-angled edge may be provided at a back corner or along a juncture of a back surface and a bottom surface of the light to enable positioning thereof on a surface to present the light beam at an upward angle. A tapped hole may be provided on each of several surfaces of the light to enable mounting the light on a stand or tripod, attaching an accessory such as a belt clip or a carabiner clip to the light, or positioning the light on a helmet, head strap or body harness. A hole cross-drilled through the light body from one exterior surface to another thereof may be provided for attachment of a lanyard, which may be used for a wrist strap or a tie for a belt or strap. The lanyard may aid in the overall ergonomic shape of the light and it fits in the palm of a user's hand when carried by attachment to the wrist.

The light size and shape may be optimized to provide comfort, portability and usefulness to the user due to its convenient size and shape format. For example, the size and shape may provide easy handling of the light in the palm of one's hand. All sharp edges and corners of the light may be chamfered to provide for a comfortable fit into the hand, reducing discomfort when the light is held for long periods and avoiding abrasion of the hand and other skin surfaces.

In a further embodiment, other switching mechanisms may be used in lieu of, or in addition to, a magnetically actuated non-contact type switch, to maintain the personal light in an off state in the presence of ambient magnetic fields, to initiate different modes of operation of the personal light, or both. A movable element may be employed to actuate, in different positions, different switches. A microcontroller may be employed in combination with a single switch to initiate various different light functions.

In a further embodiment, a rotationally movable switch actuator may be employed to enable manufacture and operation of a relatively small volume personal light. One or more magnets of different polarity orientations may be carried in a cap portion of a light housing in offset positions from an axis of cap rotation and a magnetically actuable switch selectively alignable with the magnet or magnets carried by a base of the housing. If two magnets are used, one magnet may be employed for actuating the switch and the other for maintaining the switch in an off position.

In yet another embodiment, a holder for personal light is disclosed, which holder may include structure for actuating a switch for a personal light of the present invention without manipulation of a movable actuation element within the personal light itself, to preclude inadvertent actuation of the switch, or both. If both functions are incorporated in the holder, they may be effected by two magnets of different polarity orientations with respect to a magnetically actuable switch carried by the personal light, one magnet for actuating the switch and the other for maintaining switch in an off position.

DETAILED DESCRIPTION

Figure 1A:
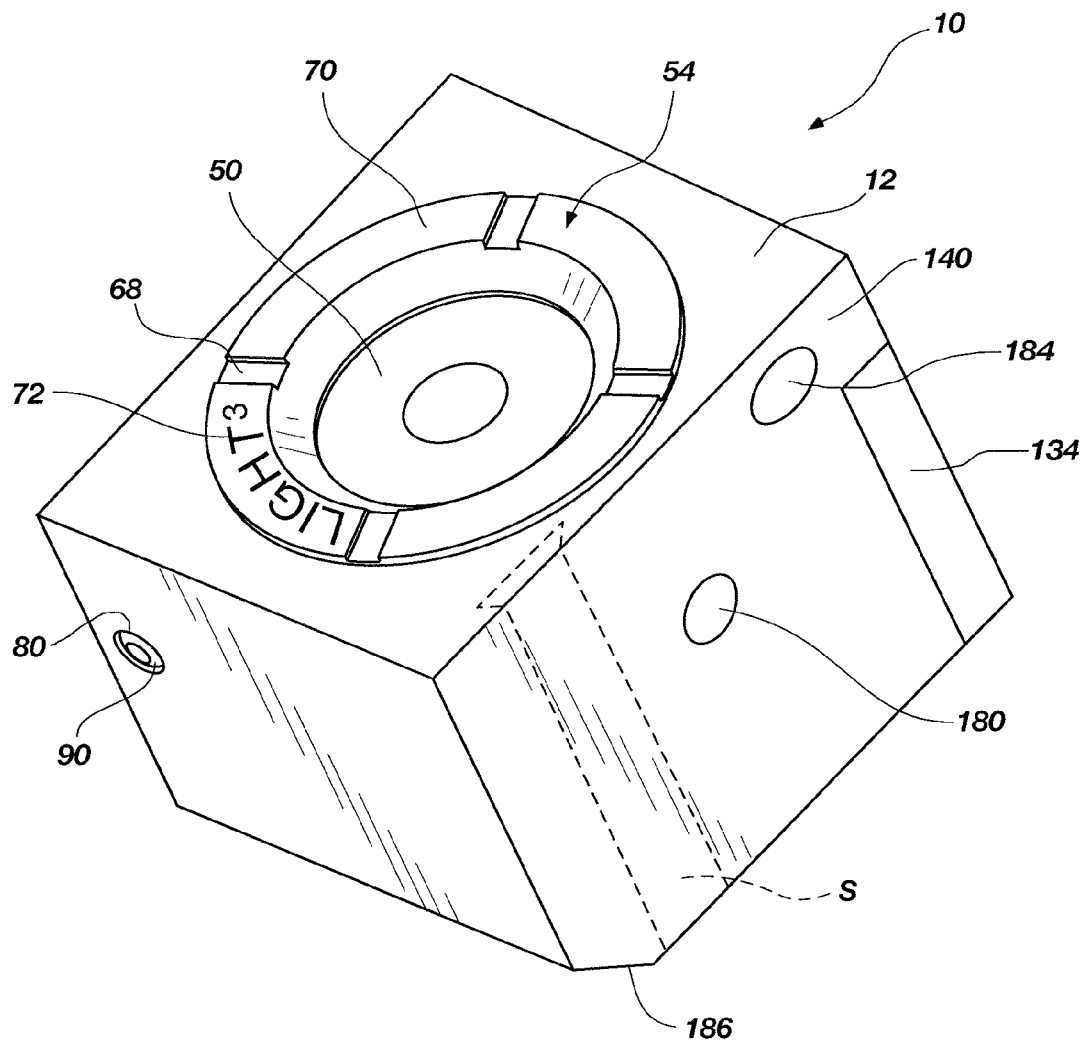
FIGS. 1A through 1D are exterior, perspective views of a battery-powered personal light of an embodiment of the present invention.

Referring to the drawing figures, the present invention comprises a battery-powered personal light 10 comprising a housing 12, which may be of cuboidal configuration. Housing 12 is preferably formed from a single blank of relatively lightweight material, such as, for example, a metal or a resin, such as a polymer. If formed of a metal, aluminum or another easily castable metal or alloy such as brass or bronze may be a suitable selection for the housing, as such materials are lightweight, easily machinable and offer good heat transfer properties, the desirability of the latter being apparent from the further discussion of the invention below. If aluminum is employed for housing 12, the exterior surface may be anodized for improved aesthetic appeal, to make the personal light 10 easier to visually locate, and for protection of the exterior surface. If housing 12 is formed of a plastic as by casting or molding, the color may be in the as-formed article. Different colors may be used for different components of personal light 10, for example, one color for housing 12 and lid 134, and another for lens cap 54, or three different colors may be employed. Of course, housing 12 may be painted if desired, or a covering film applied thereto, if a complex exterior appearance, for example, camouflage, is desired.

Figure 2:
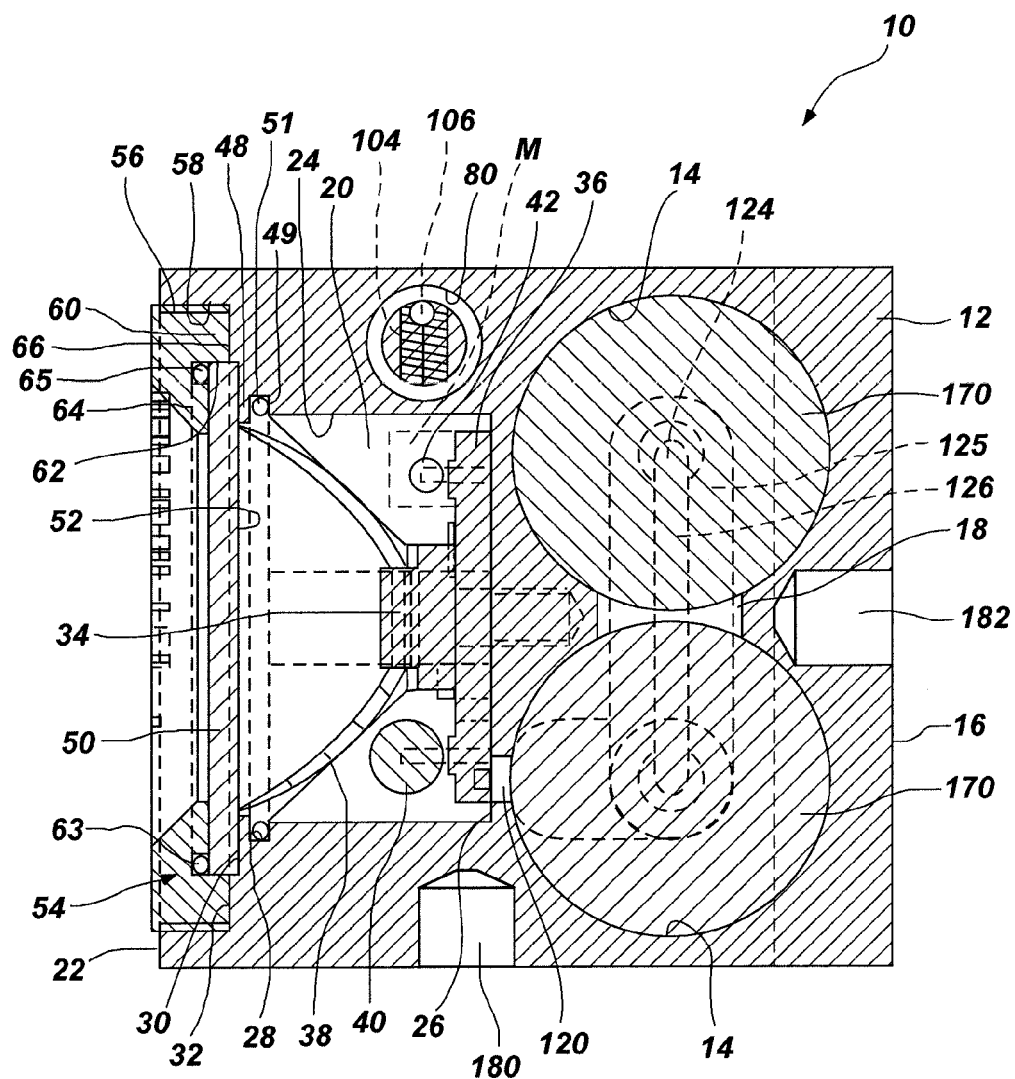
FIG. 2 is a transverse, horizontal cross-section through the battery-powered personal light of the embodiment of FIGS. 1A through 1D.

As depicted in FIG. 2, housing 12 may include twin circular battery bores 14 therein, offset toward exterior rear surface 16 of housing 12 for receiving two batteries. Battery bores 14 are laterally connected by aperture 18, which may be milled through the material of housing 12 after battery bores 14 are formed. A larger, cylindrical lighting bore 20 may be formed in housing 12 transverse to battery bores 14 and centered on the face of the exterior front surface 22 of housing 12 through which aperture 18 is formed. Lighting bore 20 includes an elongated bore wall 24 terminating inwardly at a substantially flat bore base 26 and outwardly at stepped annular recesses 28, 30 and 32 of ever-greater inner and outer diameters.

A light-emitting diode (LED) 34 mounted to a circuit board 36 and having a reflector 38 disposed thereabout and extending distally therefrom is disposed within lighting bore 20. Reflector 38 may exhibit a parabolic profile or, alternatively, a dual angle parabolic/linear (in cross-section) profile, or a multiple parabolic profile to enable multiple focal distances from a single reflector. For example, one focal distance may be selected for close-up focus, another for longer distance, such as to infinity. A current limiting device 40 and a switch 42 configured for use with a non-contact actuating mechanism may be mounted to circuit board 36 to either side of LED 34. This assembly is disposed within lighting bore 20 and aligned and secured therein by fasteners such as screws 44, engaging threaded bores 46 (see FIG. 3) formed through bore base 26.

LED 34 may be a high output (brightness) white LED such as a LUXEON® 1W LED (Lumileds Lighting, San Jose, Calif.) having relatively high efficiency for extended battery life. Nichia America Corporation, Mountville, Pa., also offers suitable high output (brightness) LEDs, as do other manufacturers. LEDs are very efficient compared to filament-type lamps, and offer high output and enhanced reliability, with operating lives approaching 100,000 hours. Reliability of such LEDs is enhanced by mounting to a heat-dissipative carrier, so circuit board 36 may be a thermally conductive circuit board with an aluminum back, for example, to act as a heat sink and transmit heat to (in this embodiment) the aluminum of housing 12. If housing 12 is formed of a poor thermal conductor such as a resin, a heat sink plug (not shown) of suitable metal may be molded into the housing 12 and placed in thermal contact with the LED 34 through circuit board 36.

Reflector 38 may exhibit a mirror finish and an associated highly reflective coating, such as elemental aluminum, to optimize light output of LED 34. There is also technology available from Fraen Corporation of Reading, Mass., for plastic injection molding of a reflector having a reflective surface as formed.

An outer rim 48 of reflector 38 is received within stepped annular recess 28. A lens 50 of greater diameter than that of outer rim 48 is disposed thereover, and the outer periphery of lens 50 is received within annular recess 30, with a portion of lens 50 projecting outwardly therefrom (along the axis of reflector 38) into annular recess 32. Lens 50 may comprise, for example, a sapphire lens, a mineral crystal lens or a polycarbonate lens. The lens 50 may be configured at least partially with an area of magnification to amplify light emanating from LED 34 and project it forward in the form of a focused beam, and the interior surface of lens 50 may be coated with an anti-reflective coating 52 to improve light transmission therethrough.

An annular lens cap 54 with a threaded periphery 56 may be disposed within annular recess 32 and secured to internal threads 58 at the periphery of annular recess 32. If desired, a sealing thread lock compound may be used to provide additional moisture resistance at the junction of annular lens cap 54 and internal threads 58. Lens cap 54 includes annular protrusion 60 along the periphery thereof, annular protrusion 60 having an inner edge 62 of slightly greater diameter than an outer diameter of lens 50 so as to extend over the outwardly projecting portion of lens 50 and center it within annular recess 30. Annular foot 64 lies radially inward of annular protrusion 60 and is of lesser inward extent, so as to contact the outer face of lens 50 and gently and uniformly press lens 50 against the outer rim 48 to fix same in place against vibration, and to seat the periphery of lens 50 against the floor 66 of annular recess 32. Elastomeric O-rings 51 and 65 may be respectively disposed in annular recess 49 of reflector rim 48 and annular recess 63 between annular protrusion 60 and annular foot 64 of lens cap 54 to provide a water- and vapor-tight seal for cylindrical lighting bore 20, as the lens 50 is sandwiched between the O-rings 51 and 65. Suitable materials for O-rings 51 and 65 include buna-N (nitrile) and fluorocarbon (such as VITON®) elastomers. As is evident from FIG. 1A, lens cap 54 may include radially extending slots 68 in the exterior face 70 thereof, by which lens cap 54 may be rotated to move inwardly to press against lens 50 and be secured to housing 12. Further, radially extending slots 68 provide outlets for light transmitted through lens 50 when LED 34 is powered and personal light 10 is placed, for example, on a flat surface with exterior front surface 22 (FIG. 2) face down. Finally, lens cap 54 provides a suitable surface for engraving of a product name, logo or other graphic as shown at 72.

Referring again to FIG. 2, a circular switch actuator bore 80 is formed in housing 12 parallel to circular battery bores 14 and to one side of lighting bore 20. As may best be seen in FIG. 3, circular switch actuator bore 80 includes a first bore portion 82 of a first diameter and a second counterbore portion 84 of relatively greater diameter. A coil spring 86 of an inner diameter greater than that of first bore portion 82 and an outer diameter less than that of second counterbore portion 84 is disposed in second counterbore portion 84 and rests on annular floor 88 at the base of second counterbore portion 84. Switch actuator rod 90 is disposed in switch actuator bore 80, a first portion 92 thereof of lesser diameter being received in first bore portion 82 and a second portion 94 thereof of greater diameter being received in second counterbore portion 84, coil spring 86 thus being received within a spring chamber 96 defined between housing 12 and switch actuator rod 90. An end portion 98 of switch actuator rod 90 of lesser diameter than second portion 94 and having rounded end periphery 100 is located on switch actuator rod 90 opposite first portion 92. Transverse spring bore 102 at the end of switch actuator rod 90 opposite end portion 98 has compressed coil spring 104 disposed therein (although, for example, an elastomer spring is also suitable), biasing detent ball 106 outwardly through ball retention aperture 108 coaxial with, but of smaller diameter than, transverse spring bore 102, which is closed at its opposite end as, for example, by deforming or pruning the spring entry mouth of spring bore 102 after coil spring 104 is disposed therein. Detent ball 106 may be oriented in any circumferential direction, for example, in a direction opposite of that depicted in FIG. 3, or otherwise. Permanent magnets 112 and 114, which may comprise (by way of example only) Neodymium, Samarium Cobalt, or AlNiCo magnets, are disposed within magnet chamber 116 formed within second portion of switch actuator rod 90 for use in actuation of switch 42, as described below. As may be seen in FIG. 3, switch actuator rod 90, which may be, for example, of brass, is formed in two parts each providing a cavity holding a permanent magnet 112 and 114, respectively, the two parts joining along line 118 to form magnet chamber 116 and being held together by the magnetic fields of permanent magnets 112 and 114.

Figure 3:
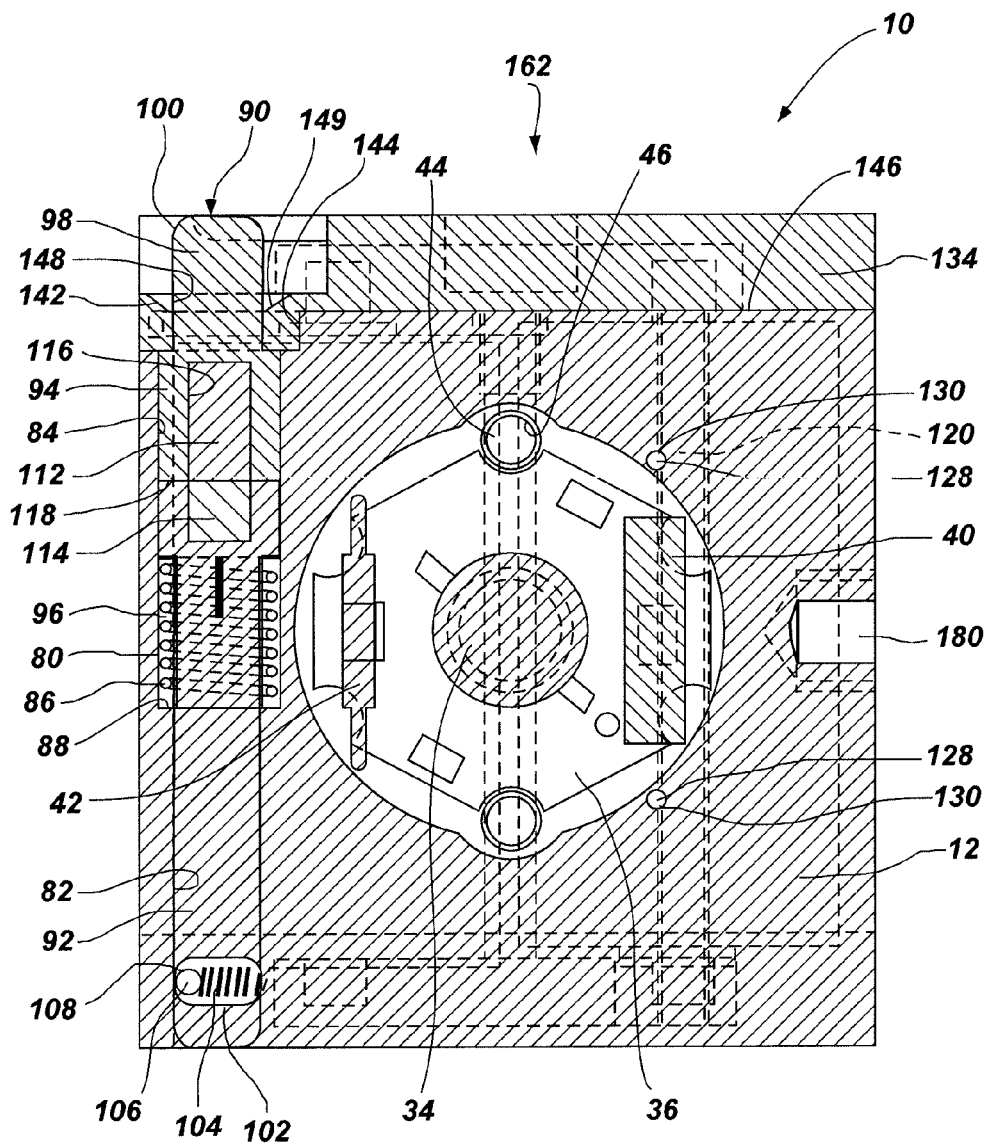
FIG. 3 is a transverse, vertical cross-section through the battery-powered personal light of the embodiment of FIGS. 1A through 1D, taken through the location of a non-contact switch thereof.
Figure 4:
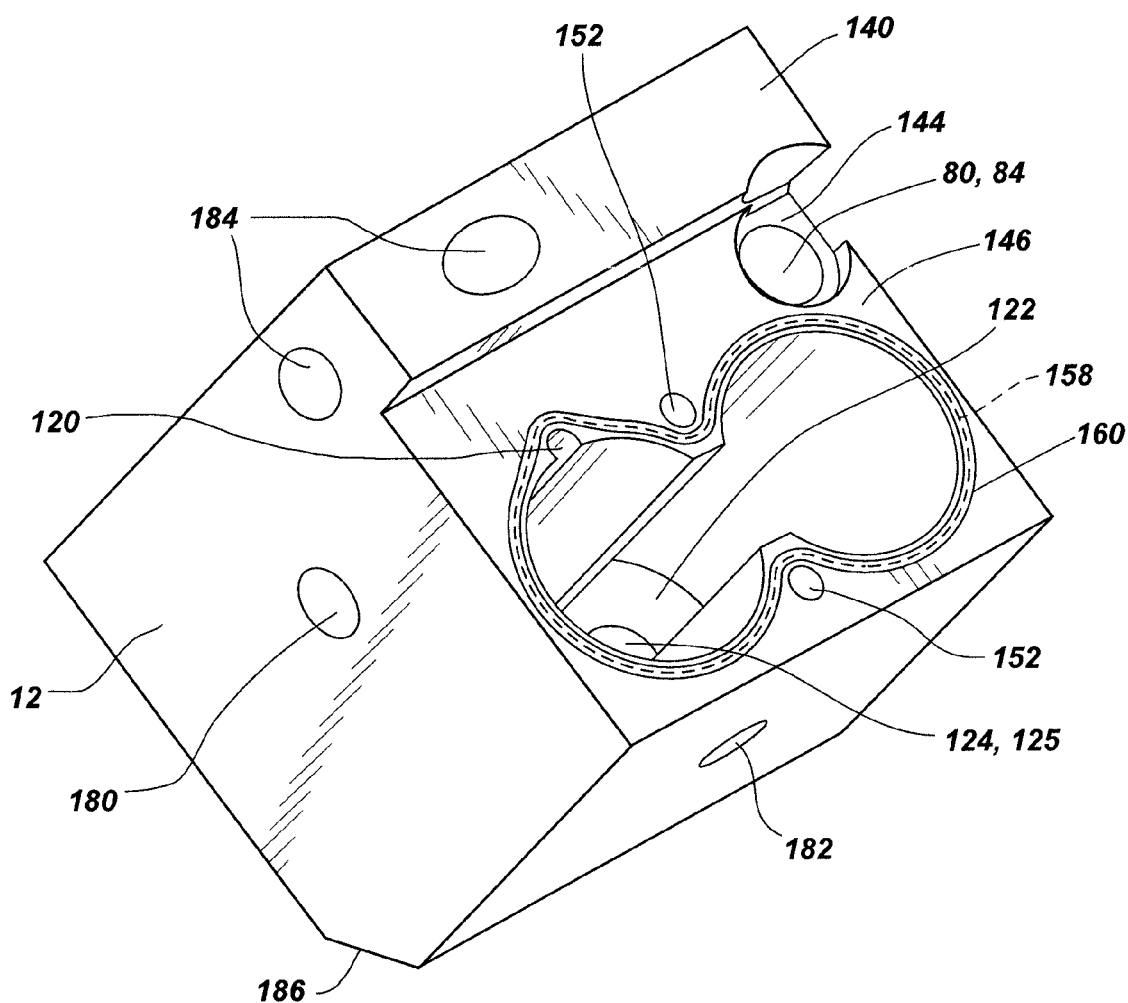
FIG. 4 is an exterior, perspective view of the battery-powered personal light of FIG. 4 is an exterior, perspective view of the battery-powered personal light with a lid thereof removed.
Figure 5:
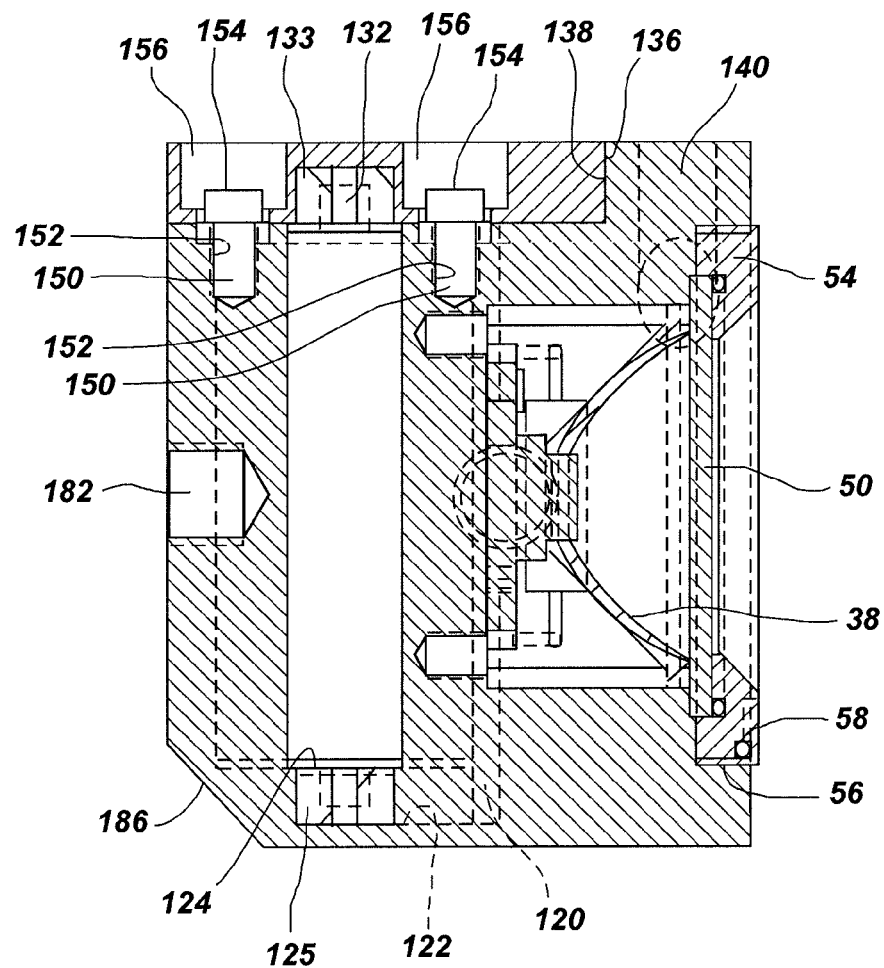
FIG. 5 is a vertical cross-section through the center of the battery-powered personal light, of FIGS. 1A through 1D from front to back thereof.

Referring again to FIG. 2, as well as to FIGS. 3, 4 and 5, it may be seen that one of the circular battery bores 14 includes a semicircular wiring chase 120 in the wall thereof, and running parallel thereto to the bottom 122 thereof, where lower battery contacts 124, extending between circular battery bores 14 through aperture 18, are disposed. Lower battery contacts 124 received in insulator tray 125 are laterally electrically connected at 126, and electrically connected in series to LED 34, current-limiting device 40 and switch 42 through wires 128 extending within semicircular wiring chase 120 and through feed ports 130 formed between circular battery bores 14 including semicircular wiring chase 120 and cylindrical lighting bore 20. Semiconductor wiring chase 120 reduces any potential for rubbing of batteries 170 against wires 128 during battery insertion or movement of personal light 10, and consequent wear and potential for shorting. If desired, wire feed ports 130 may be sealed about wires 128 with, for example, RTV silicone or an epoxy to seal off lighting bore 20 from the chamber created by battery bores 14 and aperture 18 therebetween. Wires 128 also extend within semicircular wiring chase 120 upwardly to electrically connect to upper battery contacts 132 which are carried in insulator tray 133 by lid 134, when lid 134 is disposed over housing 12. Both upper and lower battery contacts 132, 124 may be gold plated, for high reliability throughout the life of the battery to which they are connected. For enhanced connectivity, lower battery contacts 124 as well as upper battery contacts 132 may comprise multiple contact point contacts in the form of so-called "fuzz buttons" formed of gold/nickel plating over beryllium copper, such contacts being available from Technit, of Cranford, N.J. Further, spring contacts may be used at one end of each circular battery bore 14, as known to those of ordinary skill in the art to maintain a resiliently biased, impact and vibration-proof connection with the batteries. Wires 128 may extend to upper battery contacts 132 so that lid 134 is physically connected to housing 12, or may terminate at contacts (not shown) which align with resilient contacts (not shown) carried by lid 134 and electrically connected to upper battery contacts 132, as known in the art. If desired, and to prevent misorientation of batteries 170, battery contacts for the positive battery posts may be recessed, resulting in zero contact if a battery is inserted in an incorrect orientation.

Lid 134 is configured to be self-aligning with housing 12 by engagement of front surface 136 thereof with rear wall 138 of ridge 140 extending across the front of the top of housing 12. Further, a substantially annular protrusion 142 on lid 134 is received into circular cutout 144 on the upper surface 146 of housing 12, which lies to the rear of ridge 140, circular cutout 144 (which may extend partially into the rear wall 138) is coaxially aligned with second counterbore portion 84 of switch actuator bore 80. Annular protrusion 142 includes switch actuator rod alignment bore 148 therethrough, which is only slightly larger than end portion 98 of switch actuator rod 90 and receives end portion 98 therein in a non-binding manner when lid 134 is disposed over housing 12. Switch actuator rod alignment bore 148 may include dished or frustoconical mouth portion 149, to better accommodate the digit of a user when pressing end portion 98 of switch actuator rod 90 to its greatest travel. As noted below, such a recess feature may also be included in the opposite side of the housing 12 proximate the opposite end of switch actuator rod 90, and the rod 90 foreshortened so that the end thereof resides in the recess when at its full travel to prevent personal light 10 from inadvertently being placed in an off state if laid on a surface or dropped. Lid 134 may be affixed to upper surface 146 of housing 12 using fasteners such as screws 150, which engage threaded fastener bores 152 flanking aperture 18, the heads 154 of screws 150 being recessed in enlarged counterbores 156 in the top of lid 134. Screws 150 may comprise flat slotted head screws for easy assembly of lid 134 with housing 12, as well as removal and reassembly without requiring the use of special tools.

Figure 1B:
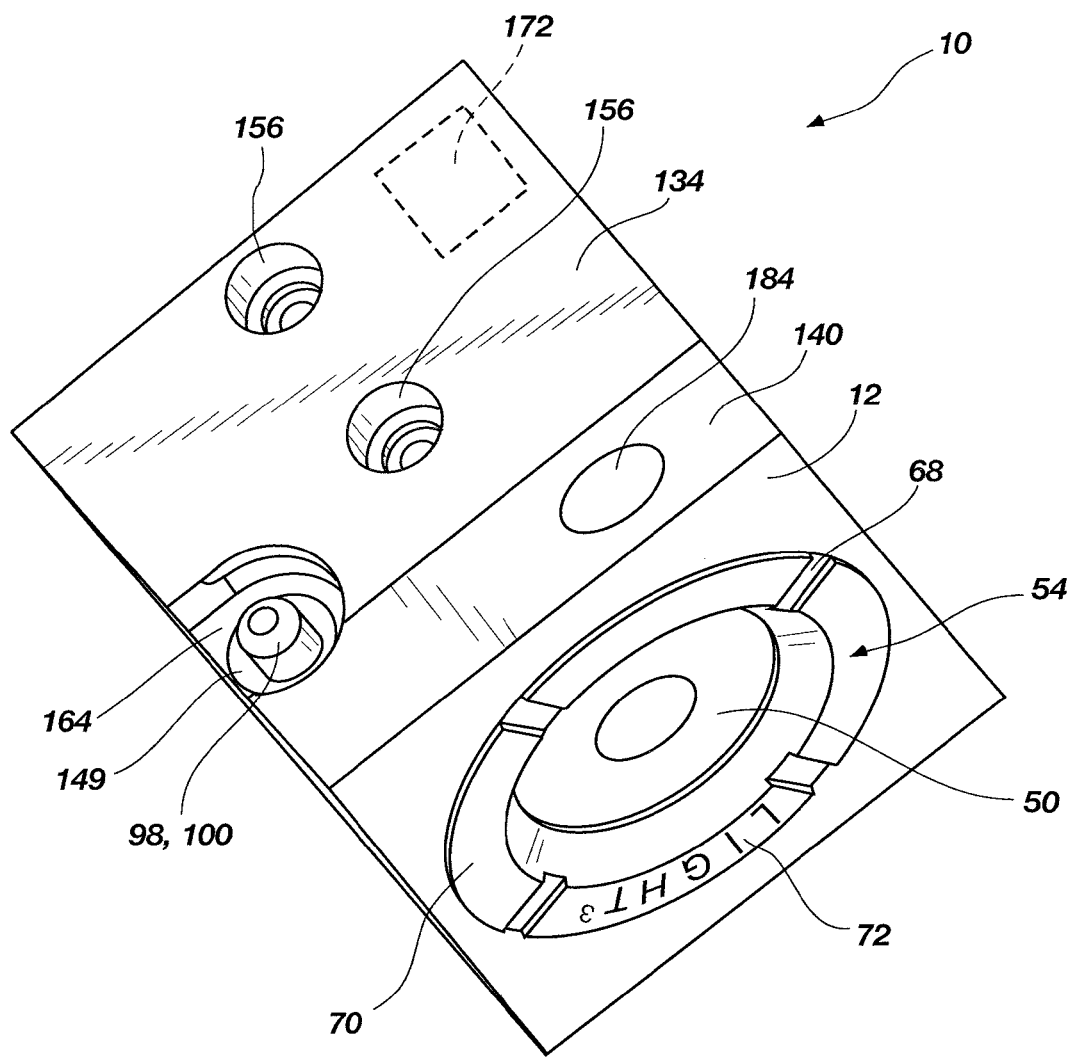
Figure 1C:
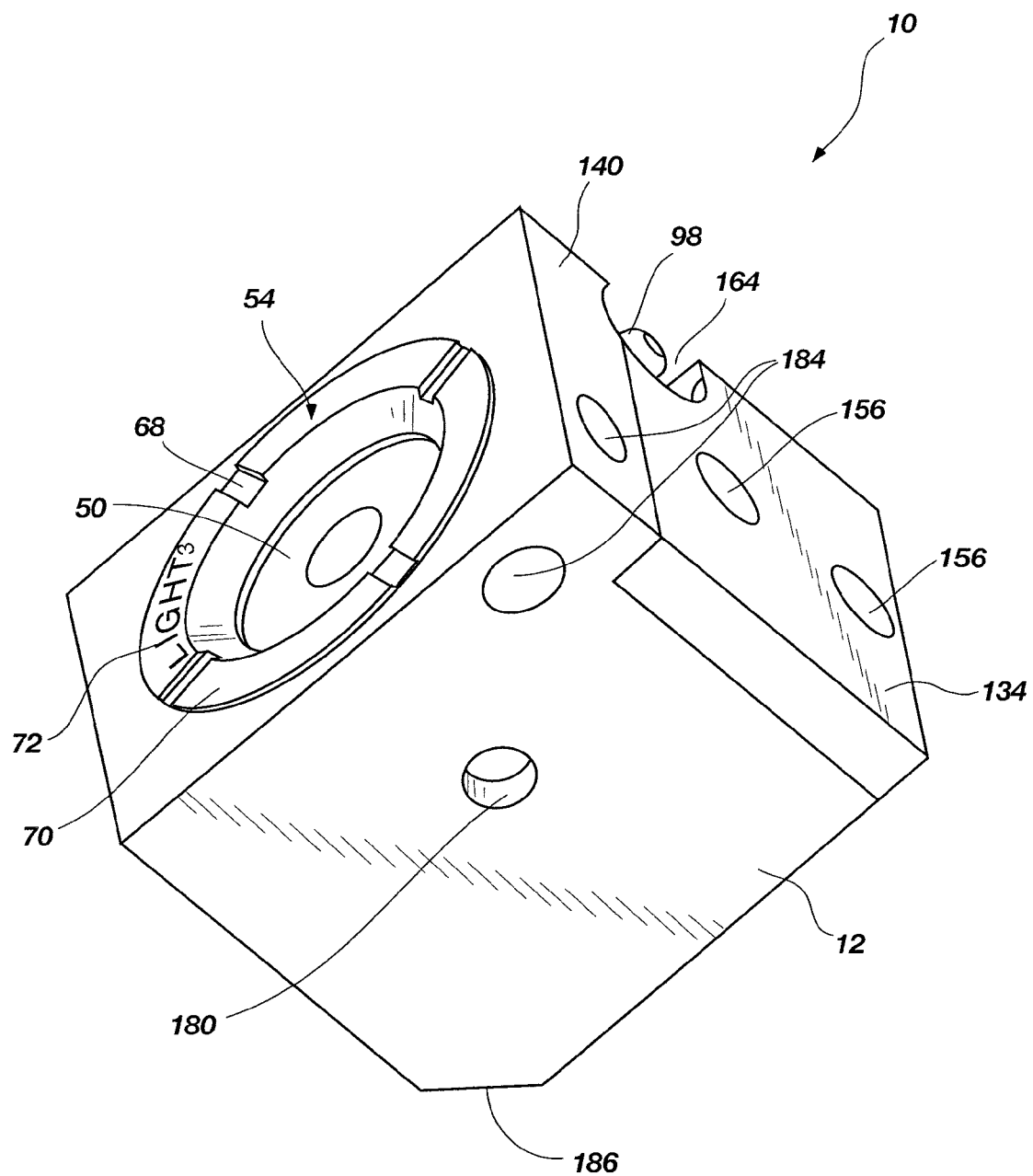

To effect a water- and vapor-tight seal between lid 134 and housing 12, a resilient gasket 158 as shown in broken lines formed of a suitable elastomer of the same materials previously referenced herein for O-rings 51 and 65 may be partially received in groove 160 formed in the upper surface 146 of housing 12, gasket 158 being compressed between lid 134 and housing 12 when screws 150 are made up in fastener bores 152. If desired, groove 160 may be formed in the underside of lid 134 and gasket 158 disposed therein; such an approach may enable the use of a larger groove 160 and associated larger cross-section gasket 158 for enhanced waterproofing. Notably, after lid 134 is assembled with housing 12, end portion 98 of switch actuator rod 90 does not protrude above upper surface 162 of lid 134 so that inadvertent contact therewith may be minimized Semi-annular recess 164 (FIGS. 1B and 1C) defined between lid 134 and ridge 140 is of sufficient size to permit a digit of a user's hand, for example, a thumb, to depress end portion 98 to activate personal light 10 as described in more detail below. As noted above and below, the use of a recess in an opposite side of the housing 12 and a shorter actuator rod 90 precludes accidental shutoff of personal light 10.

Current-limiting device 40 may comprise, for example, a resistor or a direct current-limiting regulator integrated circuit, as known in the art, the latter being typically more efficient than the former and providing extended life for LED 34. Further, a current boost circuit as known in the art may also be connected in series with the other components, to provide greater flexibility in battery selection. In addition, as a further alternative to a resistor, current-limiting device 40 may comprise a digital regulator to pulse power to the LED. The pulse frequency may be selected for sufficient rapidity so that, to a human eye, the LED will appear to be operational in steady state.

Switch 42 may comprise a Hall-effect-type magnetic reed switch or other switch susceptible to actuation using the presence or absence of an adjacent magnetic field. In environments where a significant magnetic field may be present, switch 42 may comprise an inductive or capacitive type proximity switch in lieu of a magnetic switch.

Batteries 170 that are received in circular battery bores 14 may comprise, by way of example only, commercially available 3V CR123 batteries. The type or number of batteries employed is not critical to the practice of the invention. As batteries 170 are connected in series, a 6V power supply may be provided for LED 34. It is specifically contemplated that rechargeable batteries may be employed with personal light 10 and, if so, that an inductively couplable charging mechanism 172 (FIG. 1B) may be disposed, for example, on the underside of lid 134 and wires extended therefrom to batteries 170. Such an inductively couplable charging mechanism 172 may be employed to eliminate the need for opening lid 134 and removing batteries 170 for recharging, thus avoiding any potential for compromising the integrity of resilient gasket 158 over time due to normal wear and tear. To recharge, a charger (not shown) may be placed over personal light 10, or personal light 10 placed in a charger configured with a cradle to receive personal light 10 and align inductively couplable charging mechanism 172 adjacent an inductive charging element of the charger.

Referring again to FIGS. 1A through 1D, 2 and 4, housing 12 of personal light 10 may include additional features to enhance the utility of the device. For example, threaded accessory bores 180 and 182 may be provided, respectively, in a side surface and a rear surface of housing 12, as well as in a bottom surface thereof (not shown), if desired. Thus, for example, personal light 10 may be used with a belt clip or a carabiner clip (not shown) having a threaded fastener for insertion into an accessory bore 180 or 182, or personal light 10 may be secured to a helmet, a climbing or rescue harness, or a head band or strap using a threaded fastener received in an accessory bore 180 or 182. Similarly, use of a threaded accessory bore in the bottom surface of personal light 10 may enable mounting of personal light 10 to a tripod, staff or other stand. Further, lanyard bore 184 extends obliquely between a top surface of ridge 140 and a side surface of housing 12, as best shown in FIG. 4. Thus, a lanyard, or a length of line or cable, may be used to hang personal light 10 or secure it to the person of a user or to another object. In addition, as may be seen in FIGS. 1A, 1C, 1D, 4, and 5, a chamfer 186 may be cut along the intersection of the rear exterior surface and bottom exterior surface so that personal light 10 may be rested on a flat surface and tilted upwardly at an angle. Chamfer 186 may lie at an angle approaching 45°, the precise angle for stability on a supporting surface depending upon the center of gravity of the complete assembly of the personal light 10 containing batteries 170. Of course, a chamfer may be cut at the intersection of three adjoining exterior surfaces of housing 12 and used to orient personal light 10 at an additional, different angle. It is also contemplated that a slot S (FIG. 1A) may be machined or otherwise formed into an exterior surface of housing 12 for engagement, for example, by a key secured to a power tool, a helmet, a glove, personal armor, or a firearm. Alternatively, the slot S may be configured to mate with an existing feature already present on, for example, a firearm, such as a rail on a combat hand-gun.

As noted above, the light size and shape may be optimized to provide comfort, portability and usefulness to the user due to its convenient size and shape format. For example, the size and shape may provide easy handling of the light in the palm of one's hand. Some or all edges and corners of the light may be chamfered or rounded (radiused) to provide for a comfortable fit into the hand, reducing discomfort when the light is held for long periods and avoiding abrasion of the hand and other skin surfaces. Further, several or all of the exterior surfaces of housing 12 and lid 134 may exhibit a surface treating such as knurling, or a heavy satin finish, to facilitate gripping by a user's hand.

Figure 1D:
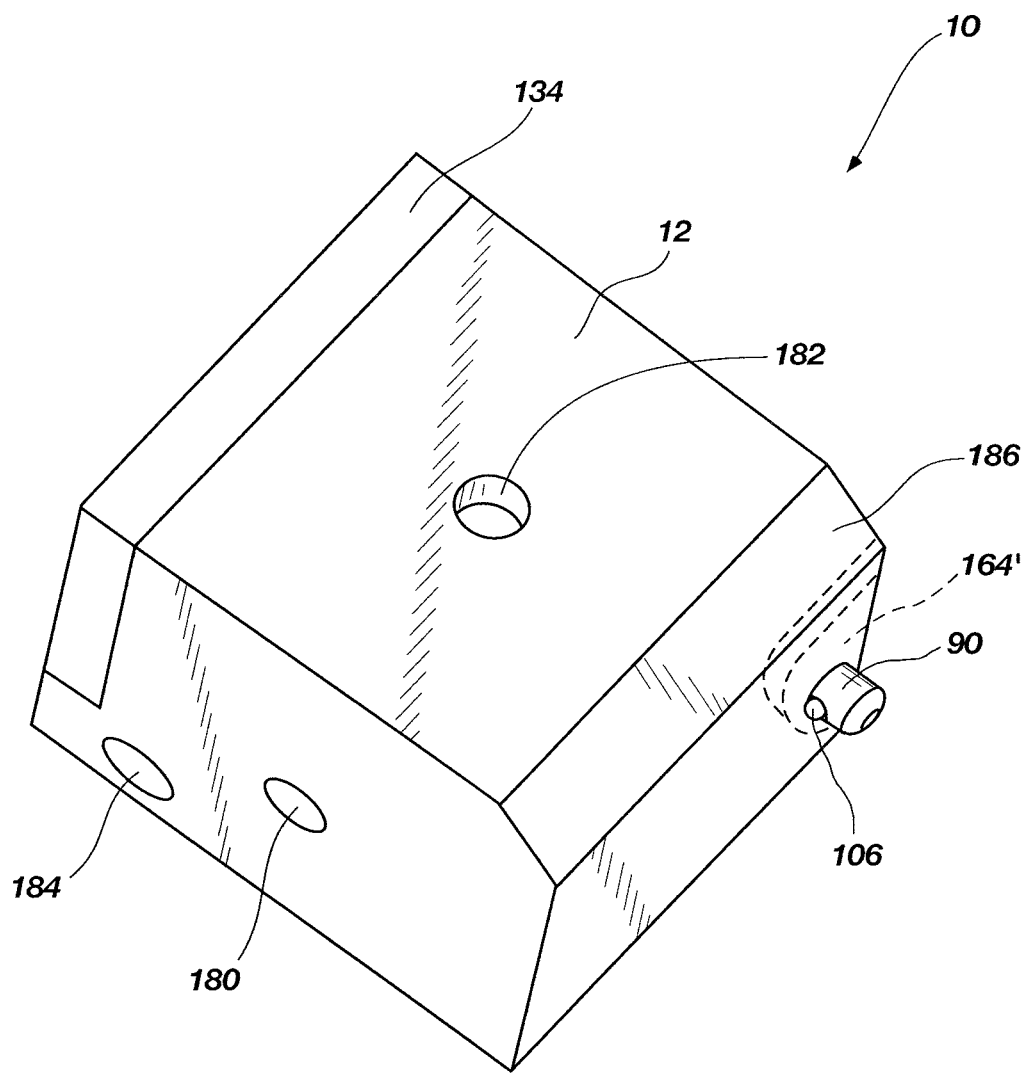

In use, personal light 10 may be activated and deactivated by manipulation of switch actuator rod 90 by the hand of a user. More specifically and by way of example only, the thumb of a user having personal light 10 cradled in the palm of his or her hand may be used to depress end portion 98 of switch actuator rod 90 to place permanent magnets 112 and 114 in lateral proximity to switch 42 to cause, in the case of a Hall-effect-type reed switch, the reed contacts to close and complete an electrical circuit to cause batteries 170 to deliver power to LED 34. Upon depression of end portion 98 to a slight degree against the bias of coil spring 86 (which prevents inadvertent actuation of personal light 10), permanent magnets 112 and 114 are placed in proximity to switch 42 to cause power to flow to LED 34 as switch 42 closes, and release of end portion 98 will cause switch actuator rod 90 to move upwardly and switch 42 to open. However, if end portion 98 is depressed further, the first portion 92 of switch actuator rod 90 will protrude through the bottom surface of housing 12 and resiliently biased detent ball 106 will extend outwardly (see FIG. 1D, wherein biased detent ball 106 has been rotated from the position shown in FIGS. 2 and 3 for clarity and to illustrate that detent ball 106 carried by switch actuator rod 90 may be circumferentially oriented as desired), locking switch actuator rod 90 in place to maintain personal light 10 in an activated mode. If desired, a cutout or recess 164' as shown in broken lines in FIG. 1D may be formed in the "bottom" of the light into which first portion 92 of switch actuator rod 60 may be caused to protrude responsive to depression of end portion 98 as depicted in FIGS. 1D and 3, and actuator rod 90 foreshortened so as to only extend into the recess 164' when personal light 10 is activated, so that personal light 10 may be placed on a supporting surface without tilting. Further, such a configuration will tend to preclude accidental shutoff of personal light 10 when placed on a supporting surface, or if inadvertently dropped.

In addition, it is not required that switch 42 rely upon a spring-biased switch actuator rod 90 for operation. Rather, and by way of non-limiting example, a resiliently biased detent ball such as detent ball 106 may be employed at each end of a switch actuator rod of suitable length, so that switch 42 may be locked into an off as well as an on position. Further, the currently depicted orientation of switch actuator rod 90 may be reversed 180 degrees, so that end portion 98 thereof and semi-annular recess 164 are located proximate the bottom of housing 12 and the opposing end of switch actuator rod 90 with resiliently biased detent ball 106 located proximate the top of the housing 12 so that the opposing end will protrude and detent ball 106 lock when personal light 10 is switched on in a manner that enables the bottom surface of personal light 10 to rest flat on a supporting surface.

In another embodiment, the resiliently biased detent ball 106 may be omitted from a spring-biased switch actuator rod 90, so that the switch 42 is normally in the off position, and returns to the off position after being activated by the spring-biased movement of actuator rod 90. Such momentary switch actuation may be used with a microcontroller M (FIG. 2) employed in personal light 10 to control different modes of operation. For example, a flashing mode as well as low and high illumination settings may be effected by initiating microcontroller M to operate in different modes.

Figure 6:
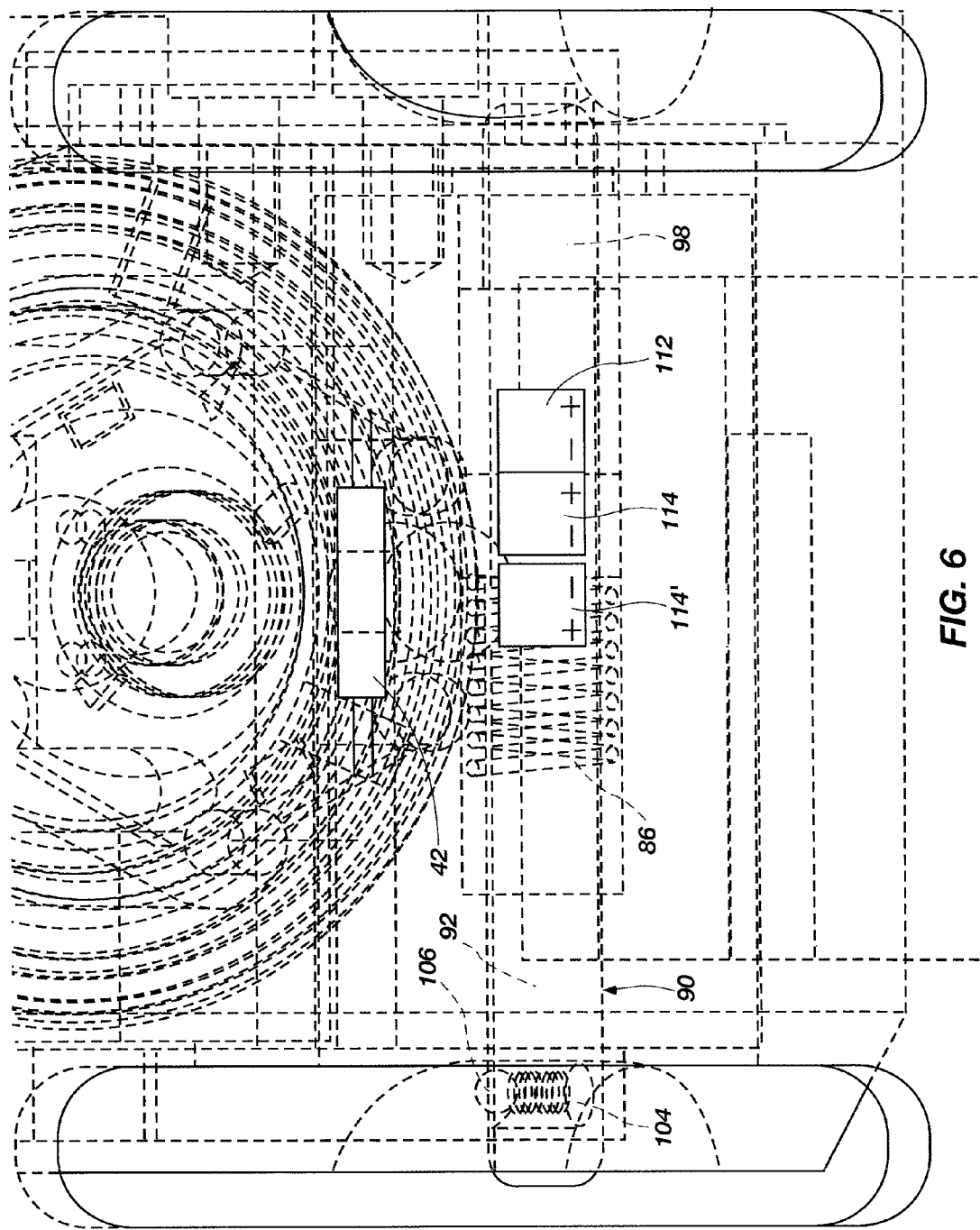
FIG. 6 is a partial sectional view of an embodiment of another switch mechanism according to the present invention.
Figure 7:
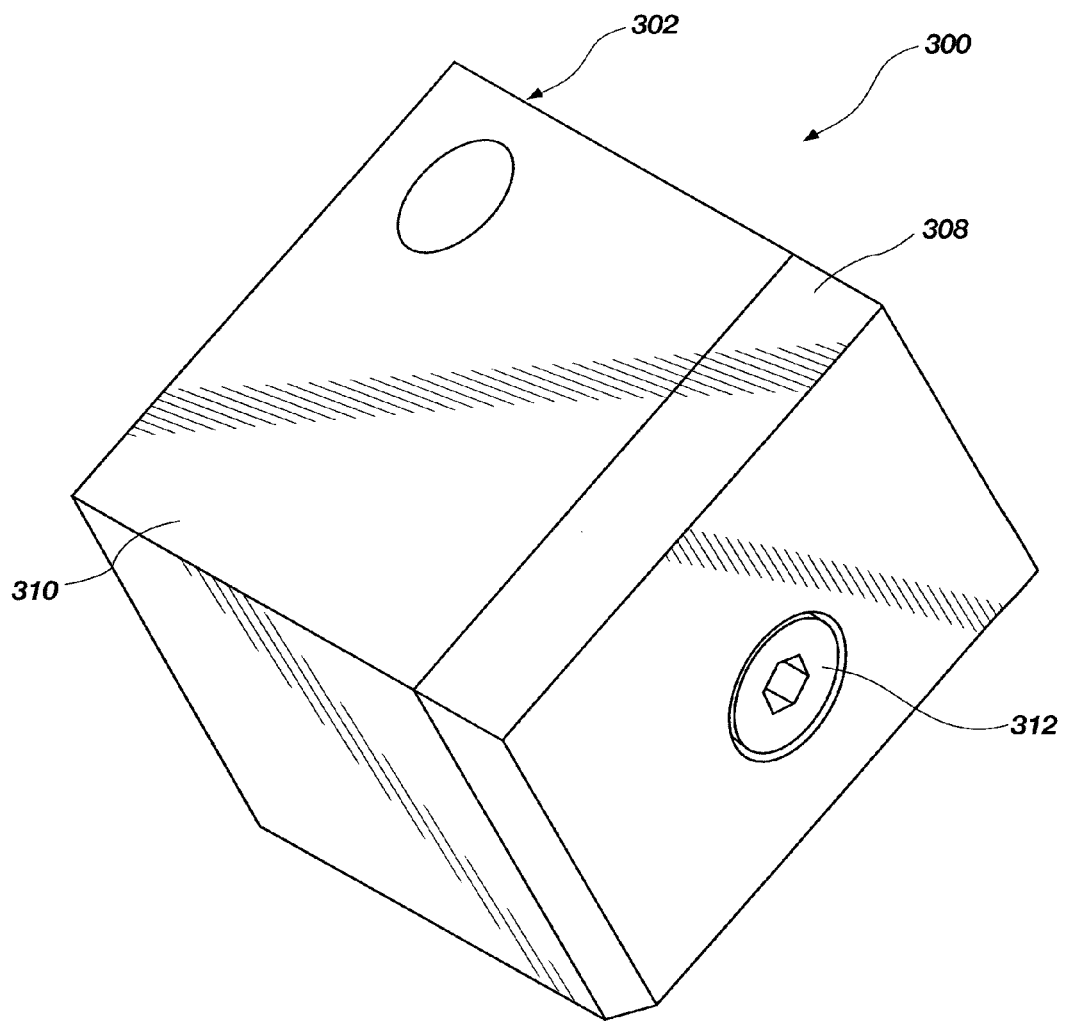
FIG. 7 is an end perspective view of another embodiment of the battery-powered personal light of the present invention, employing a rotational switching mechanism.

If a Hall-effect-type switch 42 is employed, to avoid inadvertent actuation of personal light 10 by unwanted magnetic fields (for example, from a magnetic purse clasp, an electric motor or an electromagnetic pulse) in close proximity, as shown in FIG. 6, spring-biased actuator rod 90 may be equipped with an additional magnet 114' of a polarity and location such that it is maintained in close proximity to switch 42 when actuator rod 90 is in its biased position to magnetically maintain switch 42 in its off state.

Referring now to FIGS. 7 through 10, another embodiment of a personal light 300 according to the present invention is depicted. As with personal light 10, personal light 300 employs a battery-powered LED light source. However, personal light 300 may be of significantly smaller dimensions than personal light 10 and, so, may employ a switching mechanism to control power to the LED which consumes less internal volume and permits manufacture of a more compact apparatus.

Figure 8:
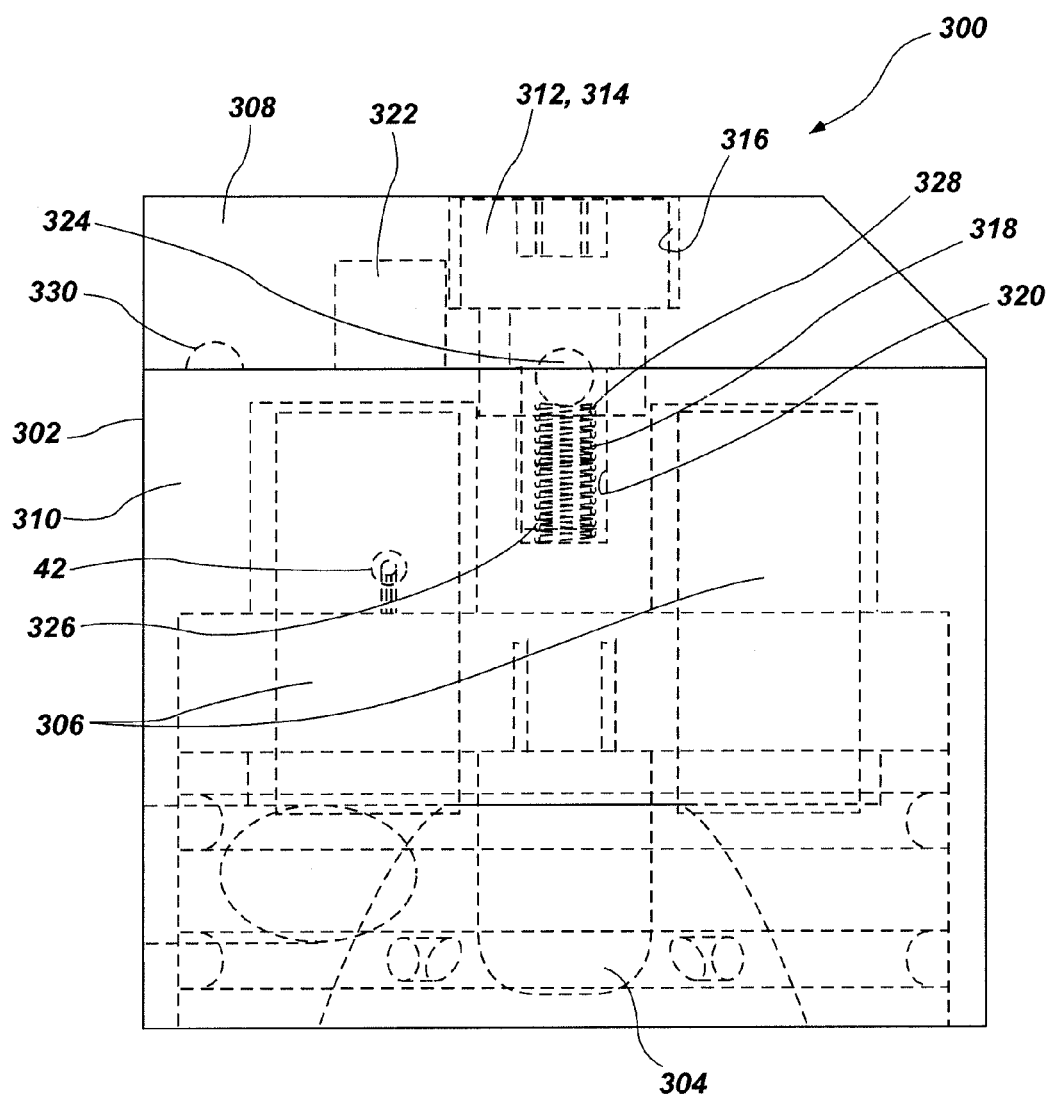
FIG. 8 is a side phantom view of one variant of the embodiment of FIG. 7.
Figure 9:
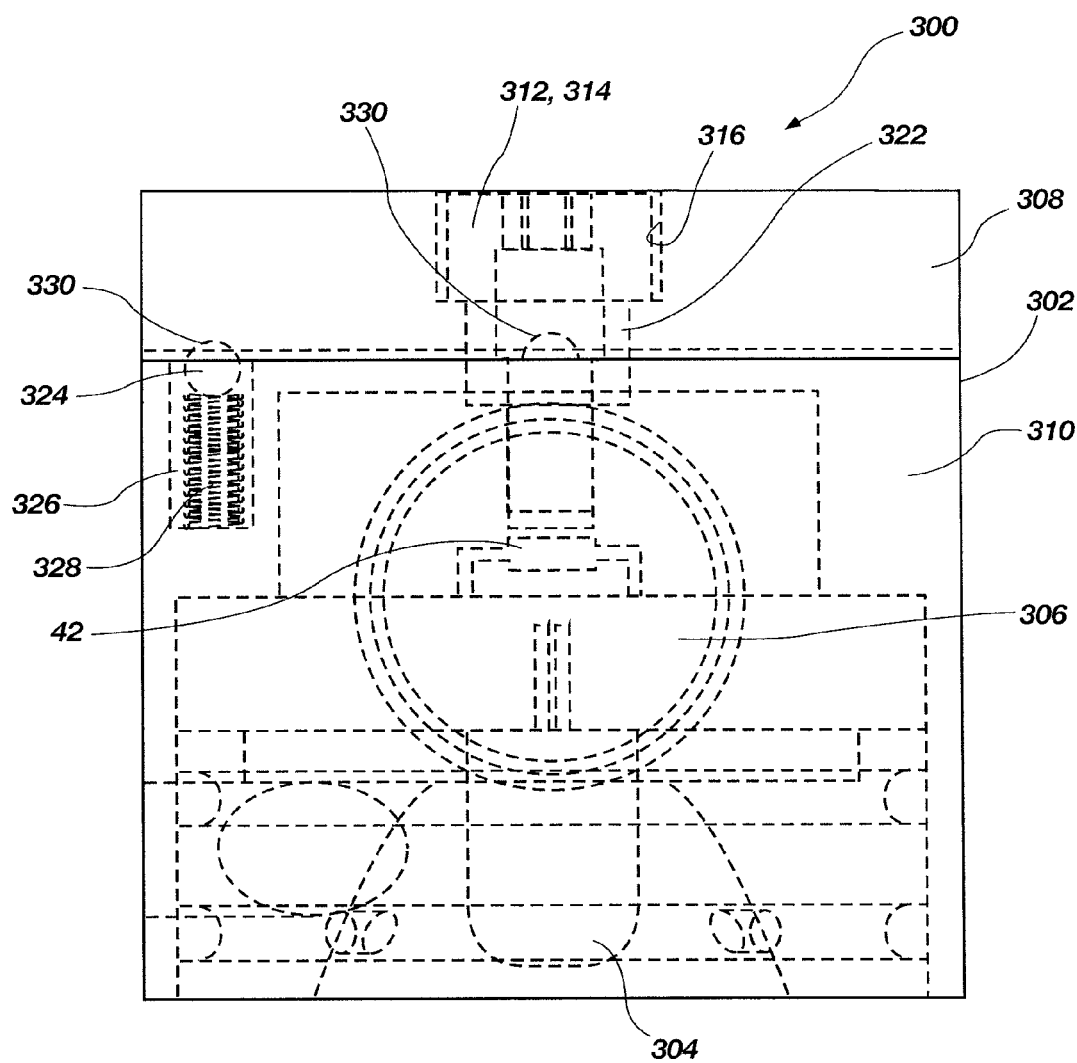
FIG. 9 is another, side phantom view of the one variant of the embodiment of FIG. 7 as depicted in FIG. 8, rotated 90° about a vertical axis.
Figure 10:
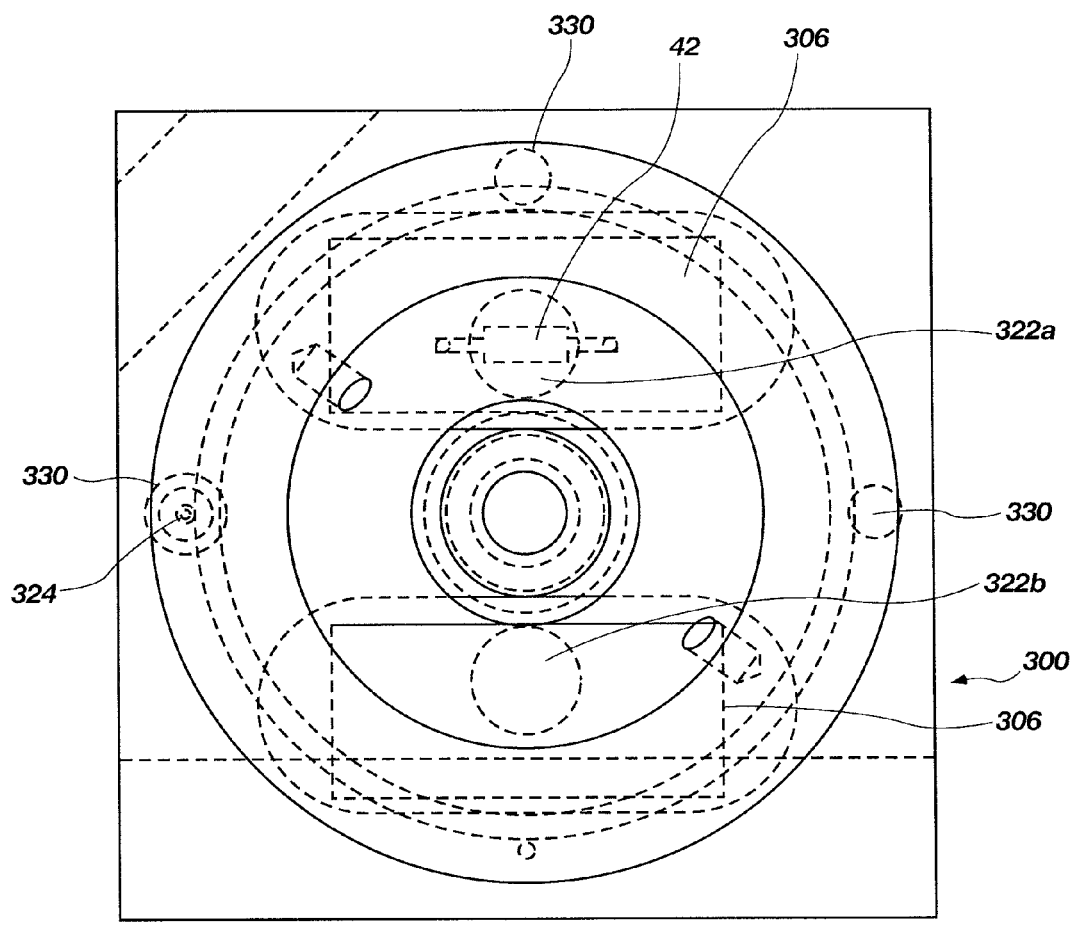
FIG. 10 is a side phantom view of another variant of the embodiment of FIG. 7.

Personal light 300 comprises a housing 302, within which is disposed an LED light source 304. Due to the relatively small volume of housing 302, two smaller batteries 306, for example, disc-shaped LR357 batteries, are disposed within housing 302. A switch 42 in the form of a proximity switch and, specifically a Hall-effect-type magnetically actuable switch, is employed. To initiate switching, however, in lieu of an actuation rod, a portion of housing 302, and specifically a cap portion 308 of housing 302 (FIG. 8) is rotatably mounted to the base 310 of housing 302 by, for example, shoulder bolt 312, the head 314 of which resides in recess 316 in cap portion 308 of housing 302, and the threaded shaft 318 of which is received in threaded bore 320 of base 310. Cap portion 308 carries one or more magnets 322, which are laterally spaced from the axis of rotation of bolt 302 so that rotation of cap portion 308 about bolt 312 moves a magnet 322 into and out of proximity to switch 42. As depicted in FIGS. 8 and 9, an actuation element in the form of a magnet 322 may be caused to reside over and in proximity to switch 42, magnetically actuating it to an on state. As also depicted in FIGS. 8 and 9, a detent ball 324 held in a bore 326 in base 310 and biased upwardly toward cap portion 308 by spring 328 may be used to retain cap portion 308 in a desired rotational orientation with respect to base 310 as detent ball 324 is held in one of a plurality of rotationally spaced recesses 330 located in the underside of cap portion 308. Accordingly, personal light 300 may then be retained in an on or an off state. As depicted in FIG. 10, two magnets 322a and 322b of different polarities may be employed in cap portion 308 in rotationally offset positions and laterally offset from the axis of rotation by substantially the same distance, so that a first magnet 322a may be deployed over switch 42 to preclude actuation thereof and maintain it in an off state even in the presence of an exterior ambient magnetic field and a second magnet 322b may be rotated over and in proximity to switch 42 to actuate switch 42 and place it in an on state.

Figure 11:
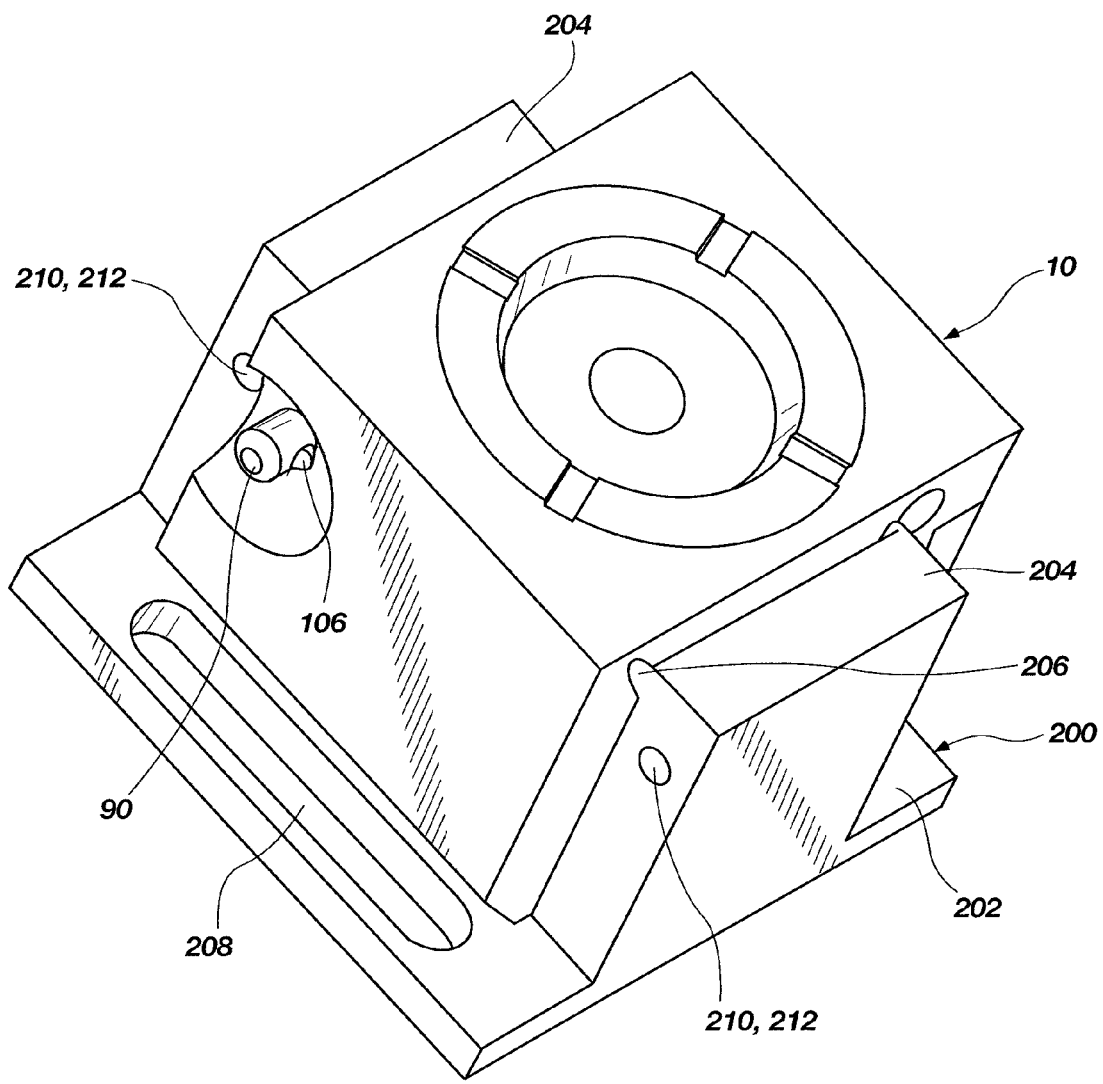
FIG. 11 is a perspective view of an embodiment of a light holder of the present invention having a personal light of the embodiment of FIGS. 1A-1D engaged therewith.

Referring to FIG. 11, it is also contemplated that personal light 10 may be used with a holder or holster 200 comprising a base 202 and two opposing, laterally spaced arms 204 extending perpendicular thereto, each arm 204 with a protrusion 206 thereon facing the other arm 204, the volume between base plate 202 and arms 204 providing a space into which personal light 10 may be received. Arms 204 may be of sufficient flexibility to permit a personal light 10 to be inserted therebetween, and spaced so that personal light 10 is gripped in a resiliently biased interference fit after passage past protrusions 206 and in abutting relationship to base 202. Base plate 202 may be provided with belt slots 208, if desired or other structure for attaching to a user's belt or to another support structure. Further, bore 210 in one or both of arms 204 may be provided with a magnet 212 to either maintain a Hall-effect-type switch 42 in an off position against unwanted magnetic field actuation, or to actuate switch 42 (FIG. 3) when personal light 10 is placed between arms 204. Alternatively, magnet 212 may be used for both functions so that when personal light 10 is placed in holder 200 in a first orientation, switch 42 is maintained in an off position by the polarity of the magnet 212 but, when rotated 180° in orientation, the polarity of magnet 212 activates switch 42. In yet another alternative, magnets 212 may be disposed in both arms 204, one magnet 212 being positioned with a first polarity orientation in one arm to maintain switch 42 in an off state when personal light 10 is in a first position and the other magnet 212 positioned in the other arm 204 with a different polarity orientation to maintain switch 42 in an on state when personal light 10 is removed from holder 200, rotated 180° and placed in holder 200 in a second position. In addition, base 202 or one or both arms 204 of holder 200 may have a spring-biased detent (not shown) built in to engage a depression in an exterior surface of personal light 10 for positive retention of personal light 10.

If a Hall-effect-type switch 42 is employed and the personal light 10 is to be employed in a military, combat environment wherein electromagnetic pulse weapons or other situations of high magnetic force may be encountered, a second, manually operated switch (not shown) may be incorporated into the power circuit of personal light 10 to physically disconnect the LED from power.

If the size of personal light 10 is scaled up so that there is more interior volume and a greater cube side length, a longer spring-biased actuator rod 90 may be employed with multiple, longitudinally spaced biased detent balls 106 to lock actuator rod 90 in different longitudinal positions to place permanent magnets 112, 114 in proximity to different, longitudinally spaced switches 42 to actuate the personal light 10 in different modes (bright, dim, flashing, etc.) using different circuitry. Further, a suitably dimensioned personal light 10 may be provided with multiple, different LED-based lighting functions; for example, an LED with a reflector may be used for producing a tightly focused beam and another LED with or without a reflector may be used or producing a flashing light or ambient background lighting.

Of course, it is contemplated that LEDs of various colors may be employed in personal light 10 for various applications. For example, a red LED may be employed for use of personal light 10 as a road hazard marker in lieu of a flare, or with an infrared (IR) or ultraviolet (UV) output for use in curing IR- or UV-sensitive products, such as dental or other adhesives.

If desired, additional circuitry and switches may be added to personal light 10 for, as non-limiting examples, high and low power settings and for initiation of a flashing mode.

Further, as desired, an extra high current demand LED may be employed when personal light 10 is fabricated of metal so that, when in operation, personal light 10 will function as a hand warmer.

While the present invention has been described in the context of a specific, illustrated embodiment, additions and deletions to, and modifications of, the illustrated embodiment will be readily apparent to those of ordinary skill in the art and are encompassed by the present invention, the scope of which is only limited by the claims which follow, and legal equivalents thereof.

What is claimed is:

1. A light, comprising:
    a cuboidal housing assembly including at least one chamber therein; and
    at least one battery disposed within the at least one chamber and operably coupled to at least one switch, and to an LED disposed within the housing assembly at a location isolated from the at least one chamber and positioned to emit light transversely through an opening in a face of the cuboidal housing;
    wherein the at least one switch comprises a proximity switch selectively actuable by placing an actuation element into proximity therewith; and
    wherein the actuation element is carried by a rod slidably received in a bore within the housing assembly and longitudinally movable between a position wherein the actuation element is out of proximity to the at least one switch and a position wherein the actuation element is in proximity to the at least one switch.

2. The light of claim 1, further comprising an element carried by the rod to preclude actuation of the at least one switch when located in proximity thereto.

3. The light of claim 1, wherein the bore passes completely through the housing assembly from an exterior surface thereof to an opposing exterior surface thereof, the rod is longitudinally biased, and further comprises an end portion exposed at one end thereof proximate the surface for manual contact thereof when the at least one switch is deactuated.

4. The light of claim 3, wherein the housing assembly comprises a recess in at least one of the exterior surface and of the opposing exterior surface.

5. The light of claim 4, wherein the recess is located in the opposing exterior surface, and the rod does not extend beyond the opposing exterior surface when the rod is moved in opposition to the longitudinal bias to actuate the at least one switch.

6. The light of claim 1, wherein the at least one switch comprises at least one of a magnetically actuable switch, an inductively actuable switch and a capacitively actuable switch.

7. The light of claim 1, further including at least one flat surface extending at least between an exterior surface of the housing parallel to the face of the housing and to another exterior surface of the housing perpendicular to the face of the housing.

8. The light of claim 7, wherein the at least one flat surface extends between two mutually perpendicular exterior surfaces of the housing or between three mutually perpendicular exterior surfaces of the housing.

9. The light of claim 7, wherein an angle of the at least one flat surface is selected in relation to a center of gravity of the light to enable the light to balance thereon when placed on a substantially flat support surface.

10. The light of claim 1, further comprising a recess in at least one surface thereof sized and configured to engage a protrusion on another structure for affixing the light thereto.

11. The light of claim 1, further comprising a holder, the holder comprising:
    a base;
    two arms extending substantially perpendicular to the base and mutually laterally spaced a distance, the two arms receiving the cuboidal housing assembly therebetween with an exterior surface of the light abutting the base; and
    a protrusion proximate a distal end of each arm a distance from the base, extending toward the other arm and abutting opposing exterior surfaces of the cuboidal housing assembly.

12. The light of claim 11, wherein the arms are sufficiently flexible to allow insertion of the light therebetween.

13. The light of claim 11, wherein at least one of the two arms carries an actuation element therein at a location to actuate the at least one switch responsive to proximity of the at least one switch to the actuation element.

14. The light of claim 13, wherein the at least one of the two arms carries an actuation element to actuate the at least one switch, and another of the at least one of the two arms carries a prevention element to prevent actuation of the at least one switch, an operational state of the at least one switch responsive to a respective proximity of the at least one switch to either the actuation element or the prevention element.

15. A light, comprising:
    a cuboidal housing assembly including at least one chamber therein; and
    at least one battery disposed within the at least one chamber and operably coupled to at least one switch and to an LED disposed within the housing assembly at a location isolated from the at least one chamber and positioned to emit light transversely through an opening in a face of the cuboidal housing;
        wherein the at least one switch comprises a proximity switch selectively actuable by placing an actuation element into proximity therewith; and
    wherein the housing assembly comprises a base and a cap portion rotatably secured thereto, the at least one switch is located in the base and the actuation element is carried by the cap portion at a location laterally offset from an axis of rotation of the cap portion with respect to the base.

16. The light of claim 15, wherein the cap portion further carries an element to preclude actuation of the at least one switch when in proximity thereto.

17. The light of claim 16, wherein the element to preclude actuation of the at least one switch is rotationally offset from the actuation element and laterally offset from the axis of rotation a substantially the same distance as the actuation element.

18. The light of claim 15, further comprising a detent structure disposed in the base and biased toward the cap portion, and at least one recess in the cap portion facing the base and sized and configured to receive a portion of the detent structure when rotationally aligned therewith.

* * * * *

UNITED STATES PATENT AND TRADEMARK OFFICE
CERTIFICATE OF CORRECTION

| | | Page 1 of 1 |
|---|---|---|
| PATENT NO. | : 8,690,379 B2 | |
| APPLICATION NO. | : 13/076000 | |
| DATED | : April 8, 2014 | |
| INVENTOR(S) | : Robert L. Canella | |

It is certified that error appears in the above-identified patent and that said Letters Patent is hereby corrected as shown below:

In the specification:

| COLUMN 2, | LINE 46, | change "maintaining switch" to --maintaining the switch-- |
| COLUMN 2, | LINES 62, 63 | change "FIG. 4 is an exterior, perspective view of the battery-powered personal light with" to --FIGS. 1A through 1D with-- |
| COLUMN 5, | LINE 59, | change "Semiconductor" to --Semicircular-- |
| COLUMN 8, | LINE 51, | change "as shown" to --(as shown-- |

Signed and Sealed this
Twenty-seventh Day of October, 2015

Michelle K. Lee
*Director of the United States Patent and Trademark Office*